United States Patent [19]

Buck

[11] 4,291,279
[45] Sep. 22, 1981

[54] MICROWAVE COMBINER ASSEMBLY

[75] Inventor: Daniel C. Buck, Hanover, Md.

[73] Assignee: Westinghouse Electric Corp., Pittsburgh, Pa.

[21] Appl. No.: 95,173

[22] Filed: Nov. 16, 1979

[51] Int. Cl.³ .......................... H03F 3/60; H03B 7/14
[52] U.S. Cl. ................................. 330/287; 331/107 C
[58] Field of Search ................ 330/56, 614, 287, 295; 331/107 C; 333/137

[56] References Cited

U.S. PATENT DOCUMENTS

| 3,231,794 | 1/1966 | Diebold. | |
| 3,474,358 | 10/1969 | Gedory et al. | 333/7 |
| 3,480,783 | 11/1969 | Mankarious | 250/211 |
| 3,581,162 | 5/1971 | Wheatley | 250/211 X |
| 3,582,813 | 6/1971 | Hines | 331/56 |
| 3,597,706 | 8/1971 | Kibler | 333/7 |
| 3,605,034 | 9/1971 | Rucker et al. | 331/56 |
| 3,668,551 | 6/1972 | Kondo | 331/96 |
| 3,896,473 | 7/1975 | DiLorenzo et al. | 357/15 |
| 3,942,130 | 3/1976 | Harp | 330/53 X |
| 4,091,334 | 5/1978 | Sechi | 330/287 |

OTHER PUBLICATIONS

Kurokawa et al., "An X-Band 10-Watt Multiple-IMPATT Oscillator", Prsc. IEEE, pp. 102-103 (1971).
Harp et al., "Power Combining of X-Band IMPATT Circuit Modules", 1973 ISSCC Digest, pp. 118-119.
Knerr et al., "Microwave Amplifier Using Several IMPATT Diodes in Parallel", 1974, ISSCC Digest, pp. 92-93.
Geller, "Solid State K-Band Power Amplifier", NASA Report No. 74-1068, Feb. 10, 1975, pp. 3-18 to 3-28.
Rucker, "A Multiple-Diode High-Average-Power Avalanche-Diode Oscillator", IEEE Trans. MTT-17, pp. 1156-1158 (1969).
Magalhaes et al., "A Single-Tuned Oscillator for IMPATT Characterizations", Proceedings of the IEEE, May 1970, pp. 831-832.
Kenyon, "A Circuit Design For MM-Wave IMPATT Oscillators", 1970 G-MTT Symp. Digest, pp. 300-303.
Kurokawa, "An Analysis of Rucker's Multidevice Symmetrical Oscillator", IEEE Trans. MTT-18, pp. 967-969 (1970).
Microwave Devices, Howes et al., Editors, J. Wiley, N.Y., 1976, Chapter 5, pp. 209-265 by Kurokawa.

Primary Examiner—James B. Mullins
Attorney, Agent, or Firm—R. M. Trepp

[57] ABSTRACT

A microwave combiner assembly is described incorporating a coaxial transmission line having a plurality of diodes exhibiting negative resistance at high frequency mounted between the center conductor and the outer conductor of the transmission line. Each diode is mounted on a segment forming a portion of the center conductor which are separated by slots containing lossy dielectric. A signal is capacitively coupled from each diode by capacitively coupling each segment to a common center conductor. Each diode is biased by coupling a bias voltage to each segment. The microwave combiner overcomes the problem of mechanically assembling a plurality of diodes in an oscillator or amplifier while attenuating anti-phase currents in the diodes indicative of undesired oscillator modes.

9 Claims, 14 Drawing Figures

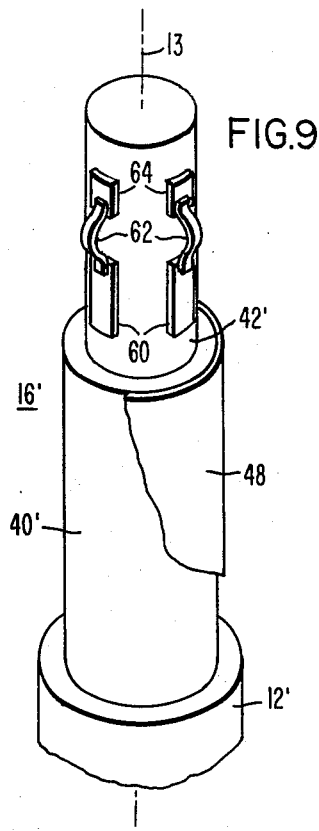
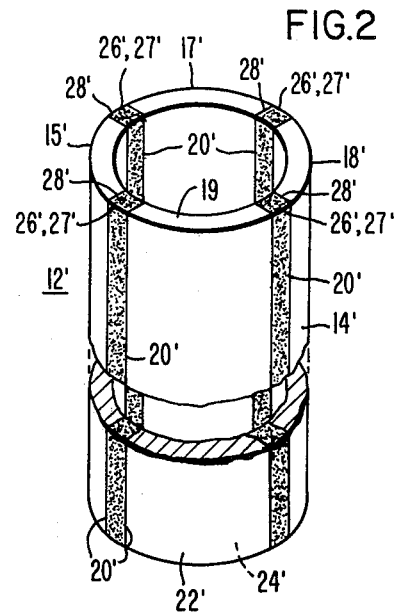
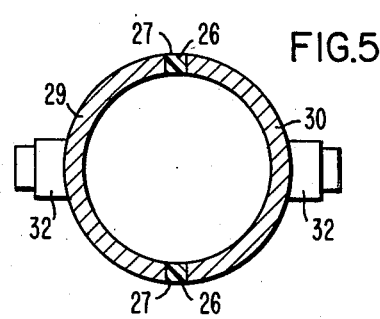
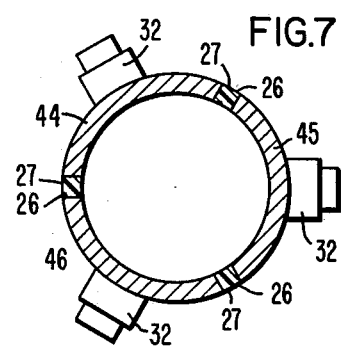
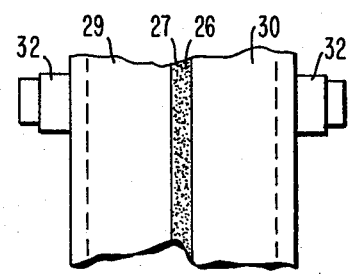
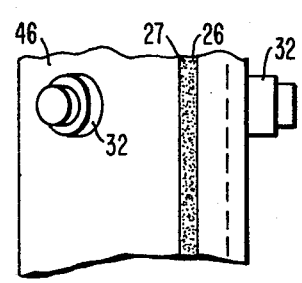

MICROWAVE COMBINER ASSEMBLY

CROSS-REFERENCE TO A RELATED APPLICATION

This application is cross-referenced to an application entitled "Amplifier With Radial Line Divider/Combiner" by J. M. Schellenberg and M. Cohn having Ser. No. 905,604 filed on May 12, 1978, now U.S. Pat. No. 4,234,854 issuing on Nov. 18, 1980, which describes a radial line divider/combiner having a radial transmission line having a plurality of sectors symmetrically disposed around the inner radius of a supporting annular substrate.

BACKGROUND OF THE INVENTION

1. Field of the Invention

The present invention relates to a microwave combiner assembly, and more particularly, to a multi-element microwave combiner employing a structurally rigid assembly of elements.

2. Description of the Prior Art

The combining of negative-resistance diodes such as, for example, IMPATT diodes to amplify microwave signals generated by the diodes in oscillators and amplifiers to provide high power microwave signals has been under investigation for a number of years. Generally, a number of diodes and associated circuits are connected in parallel whereby it is intended that each of the diodes provide an equal portion of in-phase power to a load. However, since undesirable anti-phase currents may be generated as well as the desirable in-phase currents, the various configurations of combiners have incorporated numerous schemes for suppressing the anti-phase currents while providing a low impedance path for the in-phase currents. A number of techniques are described in the literature such as, for example, the publication entitled *"Microwave Devices"*, edited by Howes and Morgan, published by John Wiley & Sons, Ltd. in 1976, and particularly Chapter 5 therein, entitled, *"Micro-Wave Solid State Oscillator Circuits"* by K. Kurokawa. Researchers in the past have attempted to combine as many diodes as possible in microwave oscillators and amplifiers, such as 64 diodes in a single combiner, in order to obtain the highest possible power output levels of the in-phase currents while simultaneously suppressing the anti-phase currents. The high power level combiners are achieved normally by coupling many negative-resistance diodes to a common waveguide cavity and providing the d.c. bias voltage to each of the diodes over individual bias conductors. In a paper entitled "A Multiple Diode High Average Power Avalance-Diode Oscillator" published in IEEE Trans. Microwave Theory Techniques, MTT-17, pp 1156–1158, December 1969, C. T. Rucker describes a fragile coupling capacitance and an N-way resistor network which are used to suppress unwanted currents. The coupling capacitance uses an insulating substrate which must be extremely thin to develop sufficient capacitance to couple the energy out. Furthermore, although Rucker uses a common bias conductor to provide a bias voltage simultaneously to all the diodes, the bias current must pass through the N-way resistor network which causes a loss in efficiency. Another configuration, which is described by Knerr & Murray in a paper entitled "Microwave Amplifier Using Several IMPATT Diodes in Parallel" in the 1974 IEEE International Solid State Circuits Conference Digest of Technical Papers, pp 92–93, is a multi-diode combiner which avoids passing a bias current through the resonator network but, on the other hand, requires the diodes to be mounted on gold "fuzz-buttons" which provide a relatively soft mechanical support causing a variable, non-reproducible resistance and a non-rigid structure.

The invention provides a very small microwave combiner, which can operate either as an oscillator or as a negative-resistance amplifier which is rugged in construction to withstand mechanical stresses such as vibration and shock. For some applications, such as for a small portable radar, excessive power levels are not required so that relatively few diodes would be needed for such applications, further contributing to a reduction in size.

SUMMARY OF THE INVENTION

The subject invention comprises a coaxial transmission line coupled to a waveguide wherein the center conductor of the transmission line is comprised of a first section assembly and a second section assembly disposed about the longitudinal axis of the line. The first section assembly has a plurality of symmetrical segments of identical configuration having longitudinal edges parallel to the axis. Each segment has a first part and a second part of predetermined lengths whereby a slot formed between adjoining longitudinal edges of respective segments in said first part is filled with a lossy dielectric means of predetermined impedance. A plurality of negative-resistance diodes are mounted in contact with respective segments in said first part being in a radial configuration about said axis at a predetermined impedance point. Each diode's cathode is in mechanical and electrical contact with its respective segment and each diode's anode is in mechanical and electrical contact with a heat sink means. A compression means is employed to retain the heat sink means, diodes, segments, and lossy dielectric means in fixed mechanical relationship to each other and to said axis. The second section assembly is mated to the first section assembly and couples a bias current to each segment and respective diodes from a power supply and couples microwave signals to said segments and respective diodes. The outer conductor of the transmission line surrounds the combined first section and second section assemblies. The negative-resistance diodes are biased by the bias current from the power supply and generate in-phase microwave signal currents in the first section assembly which are combined in the second section assembly for conduction to the waveguide and the common signal circulator. The anti-phase microwave signal currents generated by the negative-resistance diodes are suppressed by the lossy dielectric in the slots in the first part of the first section assembly and are prevented from bypassing the lossy dielectric by the non-conductive gap in the said second part of the first section assembly. The microwave combiner will operate as an oscillator when the resistance of the load transformed to the diodes is less than or equal to the absolute resistance of the diodes combined. The combiner will operate as an amplifier when the resistance of the load transformed to the diodes is greater than the absolute resistance of the diodes combined.

BRIEF DESCRIPTION OF THE DRAWINGS

FIG. 2 is a fragmentary isometric view of an alternate embodiment of the first section of the center conductor.

FIG. 5 is a top view of the first section of the center conductor of a two-diode microwave combiner.

FIG. 6 is a front view of the embodiment of FIG. 5.

FIG. 7 is a top view of the first section of the center conductor of a three-diode microwave combiner.

FIG. 8 is a front view of the embodiment in FIG. 7.

FIG. 9 is an isometric view of an alternate embodiment of the second section of the center conductor.

DESCRIPTION OF THE PREFERRED EMBODIMENT

Figure 1:
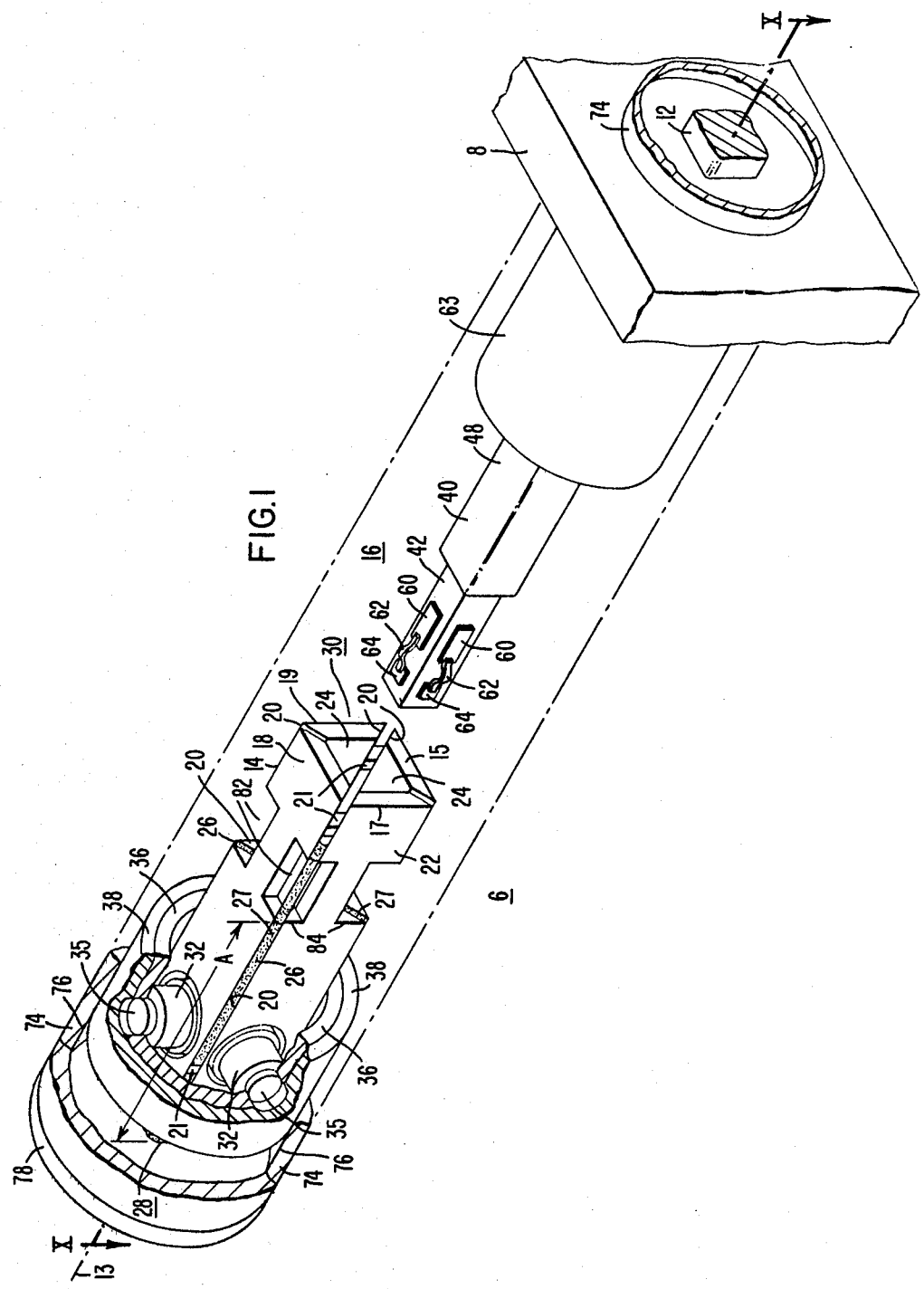
FIG. 1 is a fragmentary isometric view of one embodiment of the invention, a four-diode microwave combiner.

Referring now to the drawings, there is shown in FIG. 1 the preferred embodiment of the present invention to combine the in-phase signal outputs, in the microwave spectrum of for example 8 to 16 GH$_z$, of a number of negative-resistance diodes and to suppress unwanted anti-phase signal currents generated by the diodes that tend to flow generally between adjacent diodes. The combiner assembly 6 is comprised of a microwave signal coaxial transmission line having an outer conductor 74 and a center conductor 12 having a first section 14 which is segmented and a second section 16 for coupling microwave signals and bias currents to and from section 14. Second section 16 may be mated into a hollow cavity of the first section 14 for physical and electrical coupling between sections 14 and 16. Section 14 has four segments 15, 17, 18, and 19 composed of, for example, anodized aluminum, which are symmetrically arranged about a longitudinal axis 13 of said combiner assembly 6.

Although segments 15, 17, 18 and 19 are illustrated as flat regular rectangular plates with beveled edges, they may also be of other configuration such as, for example, segments 15', 17', 18' and 19' of a right cylindrical section as shown in FIG. 2. Segments 15', 17', 18' and 19' are each beveled inwardly from the respective longitudinal edges 20' at the outside face 22' to the inside face 24' to obtain a circular cross-section for section 14' of center conductor 12' when the respective segments are adjacent to each other along their respective longitudinal edges 20'. The adjacent segments 15', 17', 18' and 19' are separated a predetermined distance to form slots 27' between segments 15', 17', 18' and 19'. A lossy dielectric 26' is used to fill in each of the slots 27' for a predetermined length from end 28.

Figure 3:
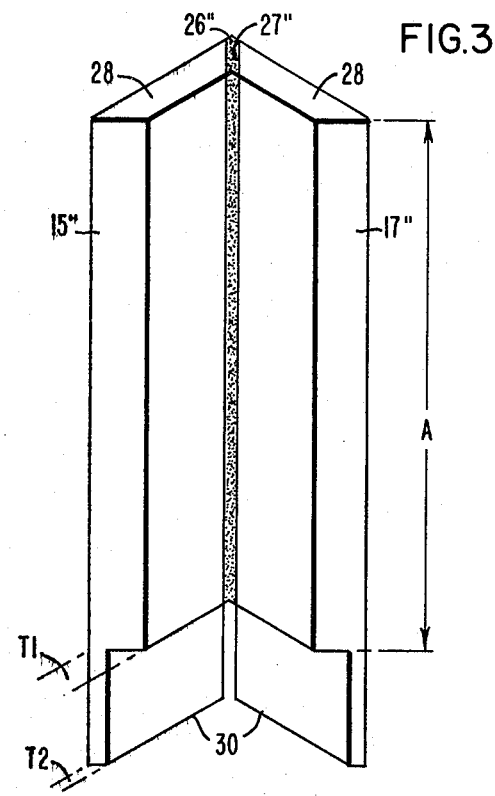
FIG. 3 is an isometric view of another alternate embodiment of two segments.

FIG. 3 shows an alternate embodiment of two segments 15" and 17" used to form a portion of first section 14. In FIG. 3 four segments would be required to form first section 14. Segments 15" and 17" are shown having thicker material of thickness T1 in the region between end 28 and the end of dimension A and a relatively thinner material of uniform thickness T2 extending from the end of dimension A to end 30. Lossy dielectric 26" is shown positioned in slot 27" between the elongated edges of segments 15" and 17". The thickness T1 of segments 15" and 17" function to improve the heat dissipation from heat dissipated in diodes 32.

Segments 15, 17, 18 and 19 of FIG. 1 are each beveled inwardly from the respective longitudinal edges 20 at the outside face 22 to the inside face 24 to obtain a square cross-section for section 14 of center conductor 12 when the respective segments are adjacent to each other along their respective longitudinal edges 20. The adjacent segments 15, 17, 18 and 19 are separated a predetermined distance such as by spacers 21 which may not be necessary to form slots 27 between segments 15, 17, 18 and 19. A lossy dielectric 26 such as, for example, silicon carbide with glass frit binder, having a predetermined impedance $R_{LD}$ at a predetermined microwave frequency is used to fill in each of the slots 27, said dielectric extending a predetermined length A from end 28 of first section 14 towards end 30 of section 14 within each of slots 27. Lossy dielectric 26 may be flexible or resilient to take up compressive stress applied in the radial direction to segments 15, 17, 18 and 19 by retaining ring 38. Likewise the spacers 21 may be flexible or resilient. One example of flexible material suitable for lossy dielectric 26 or spacer 21 is silicone rubber which may be impregnated with particles of iron or ferrite to provide the lossy characteristic. The flexible or resilient material may also provide constant stress along each slot and facilitate combiner assembly 6 to be capable of withstanding thermal and physical shock to maintain a contact force between the diodes 32 and compression ring 38 which may be a split ring or split collar. The impedance $R_{LD}$ provided by dielectric 26 suppresses the anti-phase signal currents flowing between segments 15, 17, 18 and 19. Length A is on the order of approximately a quarter wavelength, $\lambda/4$ of the predetermined signal frequency divided by the square root of the relative dielectric constant, $E_r$, of the lossy dielectric 26 or $$A = \frac{\lambda}{4} \cdot \frac{1}{\sqrt{E_r}}.$$

Figure 4:
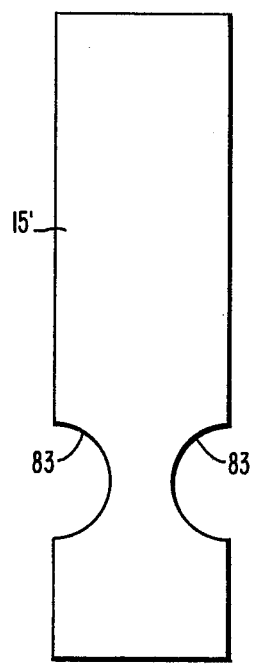
FIG. 4 is a plan view of an alternate embodiment of a segment.

Segments 15, 17, 18 and 19 have inductive openings 82 having a longitudinal dimension on the order of 0.127 centimeters for each of the pairs of adjoining segments 15, 17, 18 and 19. The opening 82 has predetermined dimensions depending on the dielectric constant and resistivity of the lossy dielectric 26 at the predetermined microwave frequency and extends from the termination end 84 of dielectric 26 in the direction toward end 30 of section 14. Openings 82, having an inductance on the order of 0.02 nh, provide an inductive reactance at the predetermined microwave frequency which will permit a shortened longitudinal dimension for section 14 and, in addition, provide for matching the impedance of the lossy dielectric to the diode impedance for reduction in signal losses. The capacitance of the combined dielectric filled slot 27 and its respective opening 82 is on the order of 50 picofarads. Although openings 82 are shown in FIGS. 1 and 10 as being rectangular, they must be of other symmetrical configurations such as, for example, a semi-circular configuration or opening 83 in segment 15' such as shown in FIG. 4.

The portion of the slot 27 extending from the openings 82 to end 30 of section 14 is an open gap to prevent the anti-phase microwave currents from bypassing the lossy dielectric 26. If the negative-resistance diodes 32 are matched closely enough so that ballast resistors 60 are not necessary, the segment slots 27 can be closed from the openings 82 to end 30 of section 14 since the anti-phase microwave currents will be unobjectionably small.

Figure 10:
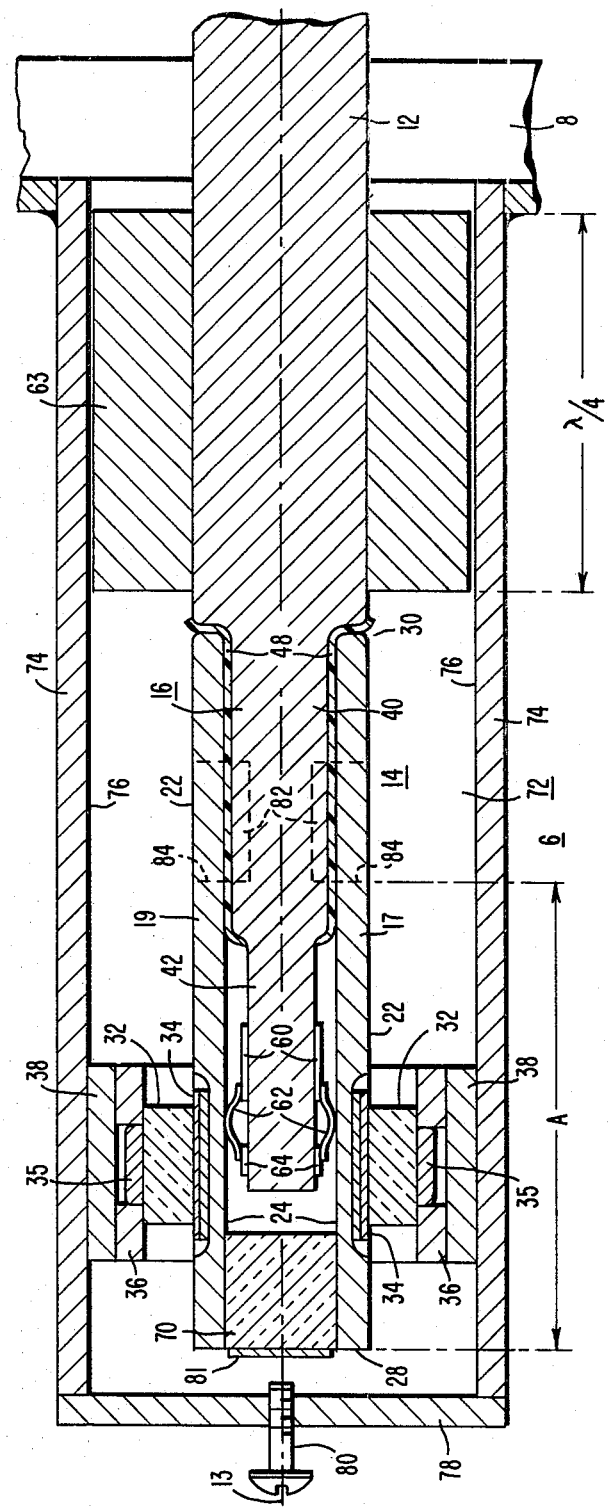
FIG. 10 is a cross-sectional view along lines II—II of FIG. 1.

Referring to FIGS. 1 and 10, a negative-resistance diode 32 is mounted on each segment 15, 17, 18 and 19, with its cathode 34 in physical and electrical contact with the its respective segment. Alternatively the anode 35 may be coupled to its respective segment. The contact can be made in a variety of configurations such as, for example, in FIG. 10 where the cathode 34 is inserted into a slight depression in outside face 22. The diodes 32 are in a spoke-like or radial configuration orthogonal to longitudinal axis 13 and at a predetermined impedance point in proximity to end 28 of first section 14. Negative resistance diodes 32 may be for example IMPATT, TRAPATT, GUNN, BARRITT, or TUNNEL devices which exhibit negative resistance when properly biased.

The anode 35 of each diode 32 is in physical contact with outer conductor 74 and a heat sink 36 which may be, for example, a ring of oxygen-free high conductivity copper, having cavities for insertion of the respective anode 35 to facilitate the dissipation of heat generated in the diodes. Alternatively the cathode 34 may contact outer computor 74. Retaining ring 38 which may be, for example, a split ring, is located on the outside of the heat sink 36 to firmly maintain the heat sink 36, diodes 32, segments 15, 17, 18 and 19 and lossy dielectric 26 in fixed relationship to each other.

Figure 11:
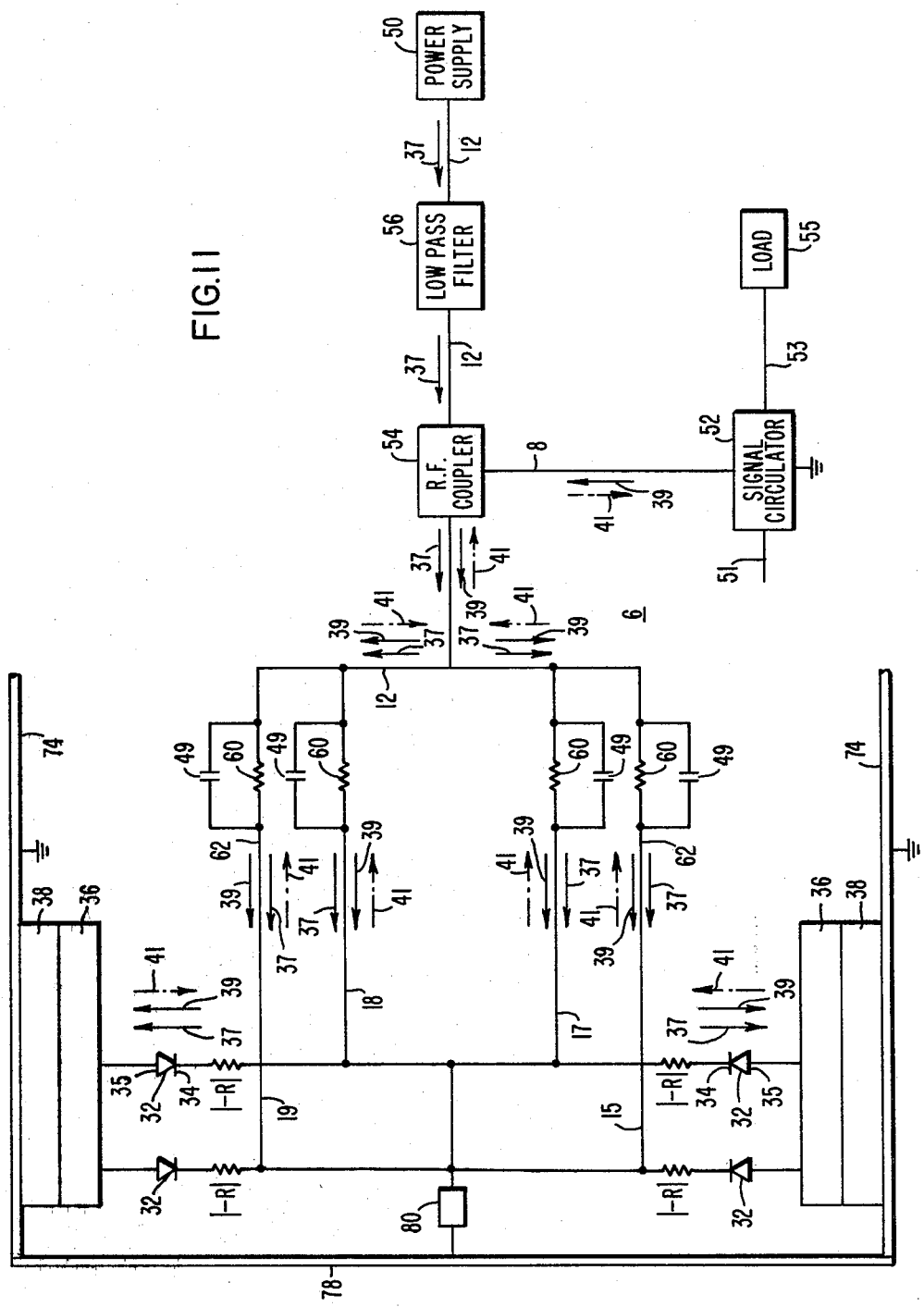
FIG. 11 is a schematic circuit of the four-diode microwave combiner of FIG. 1.

FIG. 11 shows a schematic circuit of the four-diode microwave combiner 6 of FIG. 1. A bias voltage is provided by the power supply 50 to the cathodes 34 via center conductor 12 and resistors 60 in the direction as shown by arrow 37. Simultaneously, center conductor 12 provides the conducting path for microwave signal inputs in the direction as shown by arrow 39 and microwave signal outputs in the direction as shown by arrow 41 between load 55, signal circulator 52 and combiner assembly 6 via waveguide 8 and r.f. coupler 54. The microwave input and output signals are inhibited from entering the power supply 50 by a low pass filter 56. The microwave input and output signals pass from RF coupler 54 over center conductor 12 through capacitor 49 over respective segments 15, 17, 18 and 19 to the cathode 34 of diodes 32. Capacitor 49 is formed by segments 15, 17, 18 and 19, dielectric 48 and part 40 of section 16.

As shown in FIG. 1, R.F. Coupler 54 is the portion of center conductor 12 passing through waveguide 8. Signal circulator 52, shown in FIG. 11 has a microwave signal input on line 51 and a microwave signal output coupled on line 53 to load 55. The power supply 50 and microwave components such as signal circulator 52, r.f. coupling 54, and low pass filter 56 are well known in the art and are described in various publications such as in *Microwave Engineers Handbood and Buyers Guide* issued and updated annually by Horizon House, Inc., and *Microwave Engineering* by A. F. Harvey, Academic Press, Inc., (London) 1963.

As shown in FIGS. 1 and 10, second section 16 of the center conductor 12 is comprised of parts 40 and 42. Part 40 is separated from section 14 by a dielectric 48 to form capacitor 49 having a capacitance on the order of for example 50 pf for a 10 GHz signal frequency. Capacitor 49 provides a capacitive path for transmittal of the microwave signals between sections 14 and 16. Part 42 is joined to section 14 by a resistance path formed by the ballast resistors 60 and conductive ribbons 62 for transmittal of the direct current (d.c.) bias current from section 16 simultaneously to segments 15, 17, 18 and 19 and thence simultaneously biasing all the diodes 32. Stand-off insulator 64 supports conductive ribbon 62 in maintaining physical and electrical contact with the respective segments 15, 17, 18 and 19.

Ballast resistors 60 are needed to prevent the diodes 32 from failing because of excessive d.c. currents which may occur in the event that the electrical characteristics of the various diodes are not closely matched with respect to their d.c. characteristics over a predetermined temperature range. To avoid the need for ballast resistors 60 it is desirable that the diodes 32 be matched, for example, to within 2% of their breakdown voltage. Presently, bias current variation per diode is on the order of 0.1 ampere and the ballast resistance 60 is on the order of 10 ohms for a commercial grade 1.7 watt RF cw diode.

Figure 14:
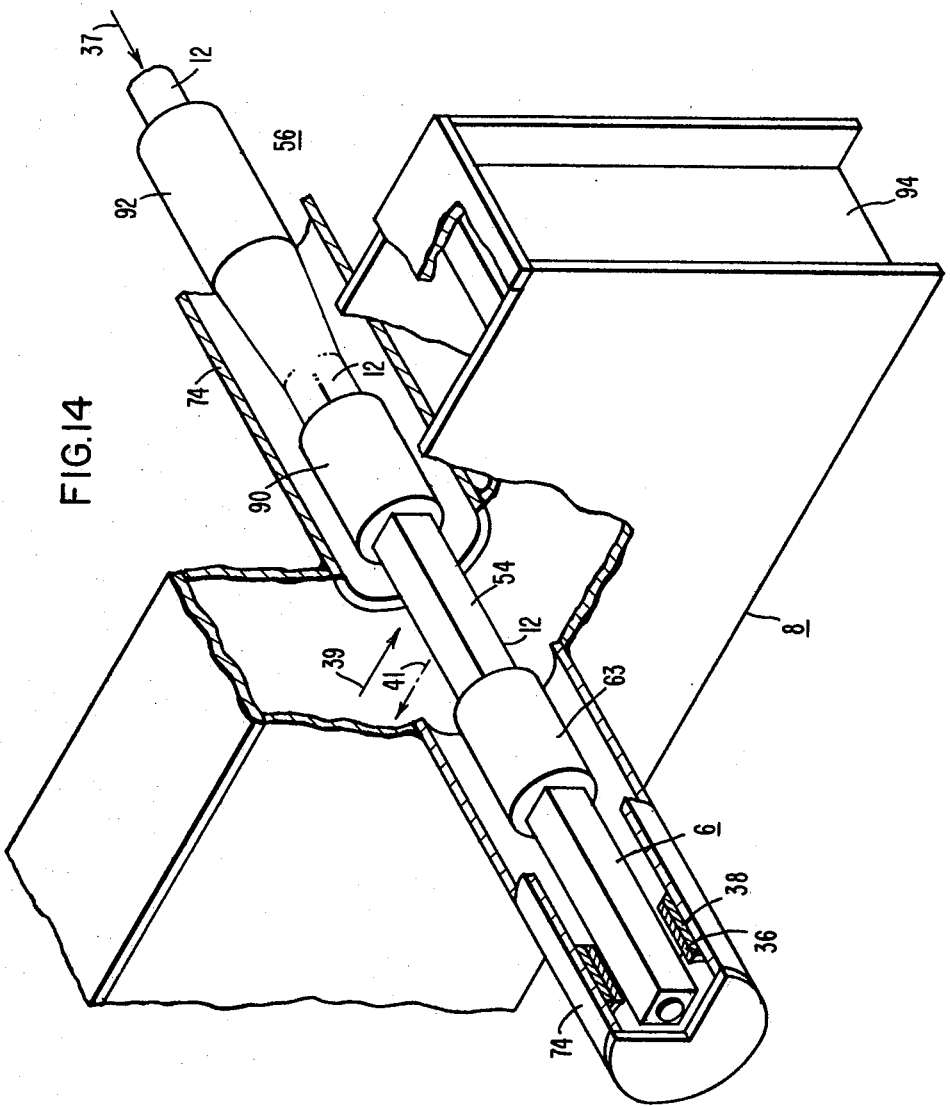
FIG. 14 is a fragmentary cross-sectional view of the microwave combiner of FIG. 1 coupled to a waveguide.

Referring to FIGS. 1, 10 and 14, an impedance transformer 63, having a length of a quarter wavelength $\lambda/4$ of the predetermined microwave signal frequency, positioned on line or center conductor 12 which adjusts by a predetermined amount the impedance of the diodes 32 in the parallel circuit to the impedance of the waveguide 8 for optimum transmittal of the microwave signal currents.

The purpose of retaining ring 38, shown in FIGS. 1, 10 and 14, is to provide a radial compressive force on the heat sink 36, diodes 32, segments 15, 17, 18 and 19 of first section 14 and a second section 16 of center conductor 12 so that the inner conductor assembly 72 becomes a rigid mechanical structure. An insulating plug 70 of, for example, ceramic composition, is inserted into the hollow cavity of first section 14 at end 28 to provide additional support to the inside faces 24 of segments 15, 17, 18 and 19 to prevent any shifting in the positions of the segments 15, 17, 18 and 19 at end 28. Segments 15, 17, 18 and 19 exert pressure against the respective conducting ribbons 62 to insure a continuous d.c. electrical path between the respective segments 15, 17, 18 and 19 of section 14 and section 16.

Segments 15, 17, 18 and 19 exert pressure against dielectric 48 to insure mechanical contact between center conductor 12, dielectric 48, and segments 15, 17, 18 and 19 for capacitive coupling of microwave signal currents.

The inner conductor combiner assembly 72 is inserted into the coaxial outer conductor 74 so that the outer conductor 74 completely surrounds inner combiner assembly 72. Retaining ring 38 is in electrical contact with the inner wall 76 of conductor 74 so that the same electrical potential will exist at the ring 38, heat sink 36, and the anodes 35 as that at the outer conductor 74. Conductor 72 extends slightly beyond end 28 of section 14 for a distance on the order of 0.02" and is capped by electrically conductive cover 78 such as, for example, gold covered kovar. A turning adjustment means 80 is provided to adjust the transmission line impedance between the inner conductor 12 and the outer conductor 74 in order to optimize the combiner output signal currents. This adjustment is made by variation of the tuning adjustment means 80 with respect to a metal plate 81, which is mounted on plug 70 and is not in electrical contact with the segments 15, 17, 18 and 19.

In operation, as shown in FIG. 11, the conductive path of the microwave in-phase currents comprises consecutively of cathode 34 of an individual diode 32, one of segments 15, 17, 18 and 19, conductive ribbon 62, ballast resistor 60, center conductor 12, thence to the r-f coupling 54, waveguide 8, signal circulator 52 and load 55, thence returning through ground to the outer conductor 74, compression ring 38, heat sink 36, and the anode 35 of said individual diode 32.

Figure 12:
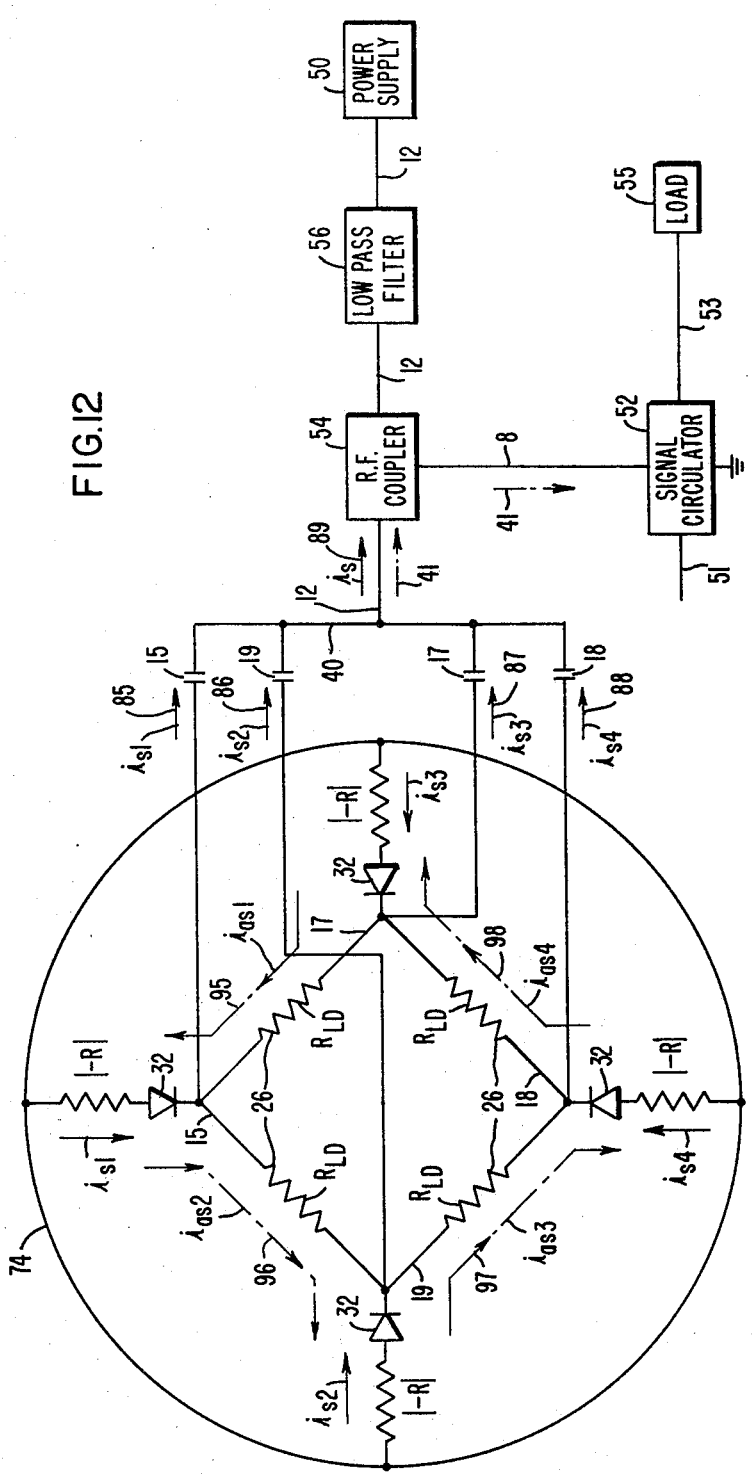
FIG. 12 is an illustration of the circuit paths of the microwave in-phase and anti-phase signal currents of a four-diode microwave combiner.

As shown FIG. 12, the in-phase currents, $i_{s1}$, $i_{s2}$, $i_{s3}$ and $i_{s4}$ as shown by arrows 85–88 respectively of the individual diodes 32 of the four-diode combiner of FIG. 1 will combine in the second section 16 of center conductor 12 resulting in a total combined current $i_s$ as shown by arrow 89. Each diode 32 has an absolute value of negative resistance $/-R_{32}/$ which combines with other diodes 32 to provide a circuit negative resistance of $/-R/$. The microwave anti-phase currents designated $i_{as1}$, $i_{as2}$, $i_{as3}$ and $i_{as4}$ and shown by arrows 95–99 respectively, have a conductive path from an individual diode 32 to an adjoining diode 32, said path crossing from the respective segments 15, 17, 18 and 19 of said first diode 32 to the adjoining respective segment 15, 17, 18 and 19 of said second diode 32 via the associated lossy dielectric 26 having a predetermined impedance $R_{LD}$ sufficient to suppress the anti-phase currents $i_{as1}$, $i_{as2}$, $i_{as3}$, and $i_{as4}$. Because of the circuit geometry of the combiner 6, the anti-phase currents following the conductive path of the in-phase currents will all cancel. It is to be noted that the path of the in-phase currents does not include the lossy dielectric 26 as a circuit element.

Figure 13:
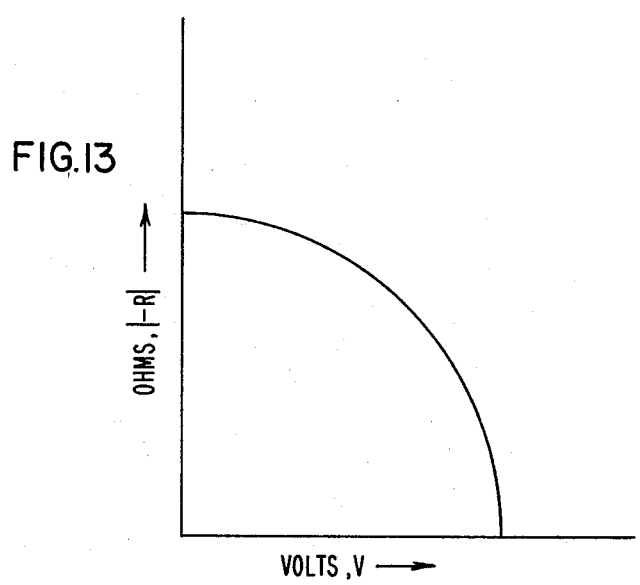
FIG. 13 is a graph illustrating operation of the microwave combiner as an oscillator or as an amplifier as a function of the negative resistance of the diodes in the drawings.

FIG. 13 is a graph illustrating the operation of microwave combiner 6 of FIG. 1. In FIG. 13 the ordinate represents absolute negative resistance in ohms of diodes 32 in the circuit and the abscissa represents the voltage V or microwave voltage across diodes 32.

Combiner 6 can operate either as an oscillator or an amplifier depending on the absolute resistance, $/-R/$, of all of the diodes 32 in the circuit relative to the positive resistance of the load transformed to the circuit at the diodes 32, at the predetermined microwave frequency. The absolute value of the negative resistance of diodes 32 is dependent on the voltage across the diodes 32. The combiner assembly 6 will operate as an oscillator when the resistance of the load transformed to the diodes 32 is less than or equal to the absolute resistance $/-R/$ of diodes 32 combined. Combiner assembly 6 will operate as an amplifier when the resistance of the load transformed to the diodes 32 is greater than the absolute resistance $/-R/$ of diodes 32 combined.

Referring to FIG. 14, a view of the microwave combiner 6 is shown with a waveguide section 8 and includes the physical configuration of the impedance transformer 63, and bias filter 56. The section of the coax center conductor 12 within the waveguide 8 functions as R.F. coupler 54 and gives rise, in effect, to a coax/waveguide transition whereby the microwave in-phase signal currents are coupled from the microwave combiner 6 to waveguide 8. The low pass bias filter 56 is comprised of an impedance transformer 90 and a lossy dielectric 92 inserted within the coax outer conductor 74 to inhibit the microwave signals from entering the bias power supply 50 over center conductor 12 shown in FIG. 11.

For pulsed operations, the preferred embodiment of the present invention should typically be able to generate 60 watts peak power at 8–12 GHz with duty factors up to 10% with four HP #0710 pulsed IMPATT diodes manufactured by Hewlett Packard. Pulsed silicon ($S_i$) and Gallium Arsenide ($G_aA_s$) IMPATT diodes exist for X and $K_u$ band frequencies, therefore, the invention will apply to frequencies up to at least 16 GHz. In regard to power handling capability, X band diodes presently exist having 50 watts peak power.

The embodiment of FIG. 1 may for example have the following dimensions, assuming that the predetermined microwave frequency is 10 GHz.

a. The length of microwave combiner 6 is on the order of 1.524 centimeters.
b. The length of the low pass filter 56 is on the order of 3.3 centimeters.
c. The diameter of combiner 6 and filter 56 is on the order of 0.4445 centimeters.
d. The length of the impedance transformers 63 and 90 is equal to λ/4 or on the order of 0.762 centimeters and have a gap on the order of 0.0254 centimeters between the respective transformers and the outer conductor 74.
e. The combiner 6 and filter 56 are centered on the broad wall of waveguide 8 and are located a distance of λ/4 or on the order of 0.762 centimeters from the shorted waveguide end 94.
f. The waveguide 8 has a broad wall inside dimension on the order of 2.286 centimeters and a narrow wall inside dimension on the order of 1.016 centimeters.
g. The inside diameter of the heat sink 36 is on the order of 0.4572 centimeters.
h. The outside diameter of the retainer ring 38 is on the order of 0.508 centimeters.

Alternate embodiments of the present invention include a two-diode, three-diode microwave combiner. FIGS. 5 and 7 illustrate the top views of the configuration of respective diodes and segments of the two-diode and three-diode combiners. FIGS. 6 and 8 show the front view of FIGS. 5 and 6 respectively. As in the four-diode combiner, the two- and three-diode combiners comprise first and second sections of the coaxial center conductor and are retained securely in place by a retaining ring. The combiner assemblies are inside of and in electrical contact with the outer conductor of the coaxial line.

In FIGS. 5 and 7 like references are used for functions corresponding to the apparatus of FIG. 1. In FIG. 5 segments 29 and 30 have a cross section of a given radius and two elongated edges at a right angle to the cross section and parallel elongated edges. The elongated edges of each segment are placed opposite the elongated edges of the other to form slots 27 which are filled with lossy dielectric 26. A diode 32 is positioned on each segment. FIG. 7 is similar to FIG. 5 except three segments 44, 45, and 46 are aligned with edges adjacent to form slots 27 between each elongated edges of each segment.

FIG. 9 shows an alternate embodiment of the second section 16' of the center conductor 12'. In FIG. 9 like references are used for functions corresponding to the apparatus of FIG. 1. FIG. 9 section 16' includes parts 40' and 42' which are cylindrical in shape to mate with a section 14' as shown in FIG. 2. The radius of the cylindrical shape part 42' is less than that of part 40' to allow conductive ribbons 62 to be mounted on part 42' and make contact with segments 15', 17', 18' and 19' of section 14'. Dielectric 48 is positioned over and around part 40' to form a capacitor 49 when section 16' is noted with section 14' of FIG. 2. Parts 40' and 42' are different contiguous areas of conductor 12' and are not separate parts attached or assembled together.

What is claimed is:

1. Microwave apparatus comprising:
    a coaxial transmission line having a center conductor and an outer conductor, said conductors symmetrically disposed about the longitudinal axis of said line;
    the center conductor having a hollow first section assembly and a second section assembly, each assembly symmetrically disposed about said longitudinal axis;
    said first section assembly having a plurality of segments having edges parallel to said longitudinal axis and positioned to form an interior hollow space of predetermined dimension segments;
    each segment having a first part and a second part of predetermined lengths whereby a slot formed between the longitudinal edges of respective segments in said first part is filled with a lossy dielectric means of predetermined impedance;
    a plurality of diodes each suitable for providing negative resistance each having a first terminal in contact with respective segments in said first part at a predetermined position along said center conductor said diodes being in a radial configuration about said axis, and each diode having a second terminal coupled a heat sink means and to said outer conductor;
    a compression means to secure said heat sink means, diodes, segments, and lossy dielectric means in fixed mechanical relationship to each other and to said axis;
    said second section assembly inserted into said hollow space of the first section assembly and having a conductive means to couple a bias current to each segment and a microwave conductive means to couple microwave signals to said segments; and
    said outer conductor surrounding the combined first section and second section assemblies.

2. Microwave apparatus as claimed in claim 1 wherein said plurality of negative-resistance diodes and respective segments comprise not less than two and not more than four diodes and segments.

3. Microwave apparatus as claimed in claim 1 wherein said coax outer conductor extends slightly beyond said first section assembly and is capped with an electrically conductive cover having a tuning means for adjusting the separation between said cover and a conductive plate means, said adjustment of the separation between the outer and inner conductors providing for optimization of the microwave in-phase signal currents.

4. Microwave apparatus as claimed in claim 1 wherein said conductive means comprises a resistor of predetermined resistance and an electrically conductive ribbon.

5. Microwave apparatus as claimed in claim 1 wherein said conductive means comprises an electrically conductive ribbon whereby said bias current being conductive from the second section via the conductive ribbon to the first section.

6. Microwave apparatus as claimed in claim 1 wherein said lossy dielectric means is resilient.

7. A microwave combiner for combining the signals of a plurality of diodes comprising:
    a coaxial transmission line having a center conductor and an outer conductor;
    said center conductor including a plurality of spaced apart segments extending lengthwise and positioned to form the outer surface of said center conductor;
    resistance means coupled between adjacent segments of said center conductor;
    said plurality of diodes each having a negative resistance characteristic at high frequency and a first and second electrode;
    each of said segments having one of said plurality diodes positioned at a predetermined distance along said segment, each said diode having its first electrode coupled to said segment and its second electrode coupled to said outer conductor;
    means for coupling a bias voltage to each of said diodes; and
    means for coupling a signal from each of said diodes together and to an output terminal.

8. An oscillator for generating a signal comprising:
    a coaxial transmission line having a center conductor and an outer conductor;
    said center conductor including a plurality of spaced apart segments extending lengthwise and positioned to form the outer surface of said center conductor;
    resistance means coupled between adjacent segments of said center conductor;
    a plurality of diodes each having a negative resistance characteristic at high frequency and a first and second electrode;
    each of said segments having one of said plurality diodes positioned at a predetermined distance along said segment, each said diode having its first electrode coupled to said segment and its second electrode coupled to said outer conductor;
    means for coupling a bias voltage to each of said diodes; and
    means for coupling a signal from each of said diodes together and to an output terminal.

9. An amplifier for amplifying an input signal comprising:
    a coaxial transmission line having a center conductor and an outer conductor;
    said center conductor including a plurality of spaced apart segments extending lengthwise and positioned to form the outer surface of said center conductor;
    resistance means coupled between adjacent segments of said center conductor;
    a plurality of diodes each having a negative resistance characteristic at high frequency and a first and second electrode;
    each of said segments having one of said plurality diodes positioned at a predetermined distance along said segment, each said diode having its first electrode coupled to said segment and its second electrode coupled to said outer conductor;
    means for coupling a bias voltage to each of said diodes;
    means for coupling an input signal to each of said diodes; and
    means for coupling an output signal from each of said diodes together and to an output terminal.

* * * * *